United States Patent
Perret et al.

(10) Patent No.: US 7,682,515 B2
(45) Date of Patent: Mar. 23, 2010

(54) NANO-IMPRINT LITHOGRAPHY METHOD INVOLVING SUBSTRATE PRESSING

(75) Inventors: Corinne Perret, Quaix-en-Chartreuse (FR); Cecile Gourgon, Cessieu (FR); Stephan Landis, La-Tour-du-Pin (FR)

(73) Assignees: Commissarieat A l'Energie Atomique, Paris (FR); Centre National De La Recherche, Paris (FR)

( * ) Notice: Subject to any disclaimer, the term of this patent is extended or adjusted under 35 U.S.C. 154(b) by 591 days.

(21) Appl. No.: 10/539,875

(22) PCT Filed: Dec. 22, 2003

(86) PCT No.: PCT/FR03/03866
§ 371 (c)(1),
(2), (4) Date: Mar. 24, 2006

(87) PCT Pub. No.: WO2004/059386
PCT Pub. Date: Jul. 15, 2004

(65) Prior Publication Data
US 2006/0183060 A1     Aug. 17, 2006

(30) Foreign Application Priority Data
Dec. 23, 2002   (FR)   .................................. 02 16540

(51) Int. Cl.
*C03C 15/00* (2006.01)
(52) U.S. Cl. .............. 216/41; 216/40; 216/44; 216/52; 438/691; 438/700; 438/735; 427/256; 427/466; 427/595
(58) Field of Classification Search .................. 216/44; 438/691; 427/466
See application file for complete search history.

(56) References Cited

U.S. PATENT DOCUMENTS 5,772,905 A * 6/1998 Chou ........................ 216/44

(Continued)

FOREIGN PATENT DOCUMENTS

WO      WO 01/79933 A1    10/2001

OTHER PUBLICATIONS

J. Pavlinec, Journal of Applied Polymer Science, vol. 55, (1995) pp. 39-45.*

(Continued)

*Primary Examiner*—Binh X Tran
*Assistant Examiner*—Maki Angadi
(74) *Attorney, Agent, or Firm*—Brinks Hofer Gilson & Lione

(57) ABSTRACT

The inventive method includes a preparation step during which the substrate is covered with a layer, a pressing step in which a mould including a pattern of recesses and protrusions is pressed into part of the thickness of the aforementioned layer, at least one etching step in which the layer is etched until parts of the surface of the substrate have been stripped, and a substrate etching step whereby the substrate is etched using an etching pattern which is defined from the mould pattern. The preparation step includes a sub-step consisting of the formation of a lower sub-layer of curable material, a step involving the curing of said layer and a sub-step including the formation of an outer sub-layer which is adjacent to the cured sub-layer. Moreover, during the pressing step, the above-mentioned protrusions in the mould penetrate the outer sub-layer until contact is reached with the cured sub-layer.

11 Claims, 1 Drawing Sheet

U.S. PATENT DOCUMENTS 6,680,214 B1 * 1/2004 Tavkhelidze et al. .......... 438/20
2002/0042027 A1 * 4/2002 Chou et al. ................ 430/322
2002/0170880 A1 11/2002 Chen

OTHER PUBLICATIONS

R. Allen, IBM Journal fo Research and Development, vol. 41, No. 1/2, (1997), pp. 95-104.*

Sun et al. Journal of Vacuum Science Technology, B1696), Nov./Dec. 1998, pp. 3922-3925.*

Lebib et al., "Tri-Layer Systems for Nanoimprint Lithography With an Improved Process Latitude", Microelectronic Engineering 53 (2000), pp. 175-178.

* cited by examiner

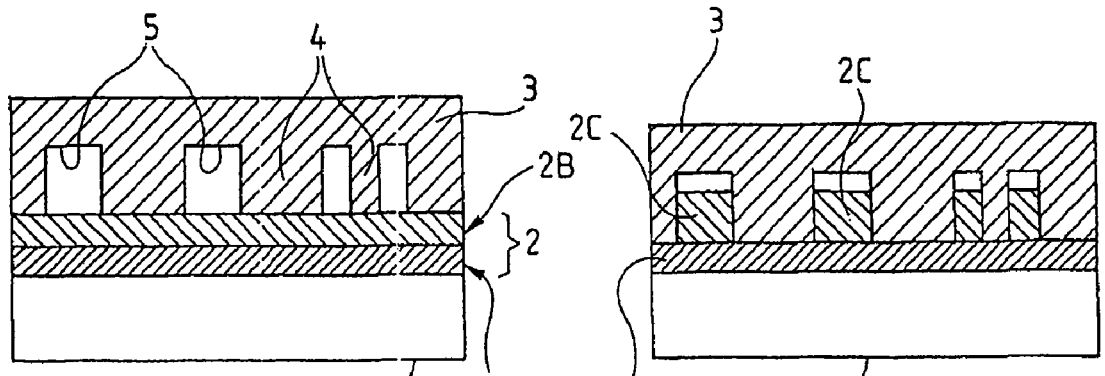
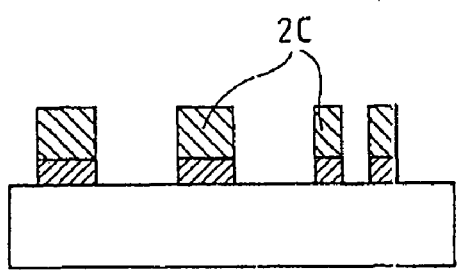
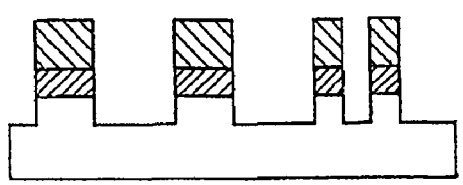
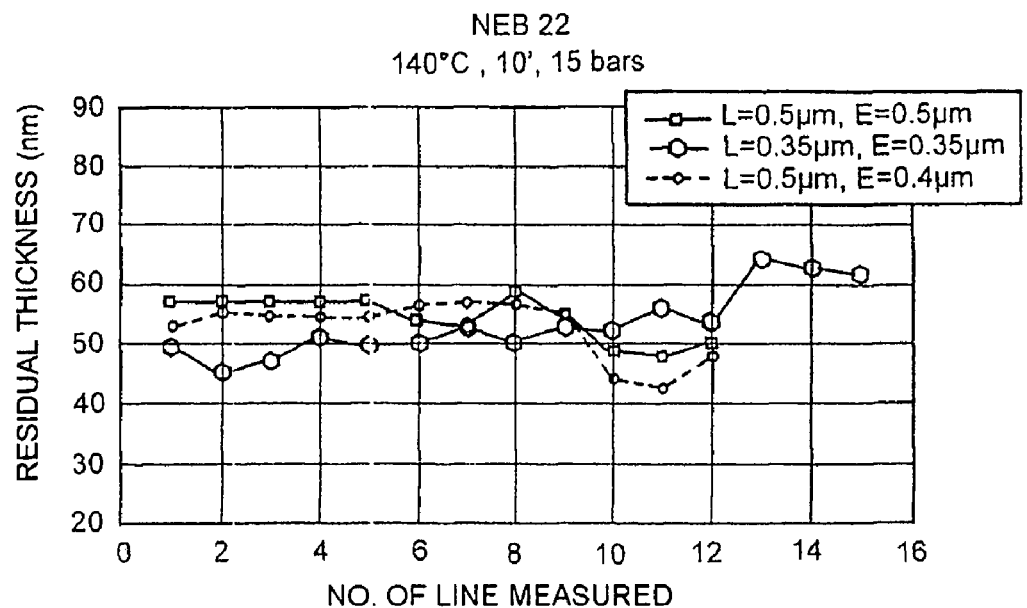
Fig. 5

NANO-IMPRINT LITHOGRAPHY METHOD INVOLVING SUBSTRATE PRESSING

This application claims benefit of priorty to French Patent Application No. FR 0216540 filed Dec. 23, 2002.

TECHNICAL FIELD

The invention relates to nano-imprinting, also known as NanoImprint Lithography (NIL), which is a lithography technique for microtechnologies involving pressing substrates.

This technique has diverse advantages over known methods: it enables the same resolutions to be obtained as electronic lithography much faster and at lower cost. In practice, the objective is to product nanostructures (structures on a submicron scale, typically from a few tens to a few hundreds of nanometers) over large areas. It may have particular applications in the production of high-density magnetic storage components, optical components based on photonic crystals, and biotechnologies.

BACKGROUND

Nano-imprinting consists in pressing a mold into a polymer covering a substrate of silicon or another appropriate material. The mold is typically produced in silicon by standard lithography/etching techniques and is pressed into a layer of polymer heated to above its glass transition temperature so that it is deformable. After cooling and removal of the mold, the patterns of the mold are imprinted in negative form in the polymer.

To prevent potentially destructive contact between the mold and the substrate that supports the polymer, a thin residual layer of polymer is intentionally left at the bottom of the protruding patterns of the mold. The pressures applied to the mold are such that, if the mold and the substrate were to come into direct contact, the two wafers would be weakened and could break. To guarantee the presence of this residual layer, the initial polymer thickness is chosen so that, at the end of pressing, the polymer fills the recesses of the patterns of the mold.

The residual polymer thickness is then eliminated by an oxygen plasma, which locally exposes the substrate. The patterns of the polymer layer are then reproduced in the substrate (transferred thereto) by plasma etching (typically by reactive ion etching (RIE)), as in the usual lithography/etching situation.

A technique of the above kind is described in the document "Imprint of sub-25 nm vias and trenches in polymers" by S. Y. CHOU, P. R. KRAUSS, and P. J. RENSTROM, published in Appl. Phys. Lett. 67 (21) 20 Nov. 1995, pp. 3114-3116.

The main difficulty of the above technique is obtaining a uniform residual thickness regardless of the size and the density of the pressed patterns. If the residual thickness at the bottom of the pattern is not homogeneous, the oxygen plasma that is intended to eliminate it will induce a local modification of the size of the patterns where the layer is thinnest; because the patterns are unknown a priori, this reduction in size cannot be taken into account in determining the dimensions of the patterns of the mold. This leads to inaccurate control of the dimensions of the patterns, which is incompatible with industrial use of this technique.

This erratic modification of the size of the patterns of the polymer layer may be explained as follows.

Firstly, the local differences in the residual thickness result from the fact that, the closer together the protrusions and the recesses of the pattern of the mold, the more the penetration of the mold into the polymer layer implies the displacement of a significant quantity of material, and the more difficult it is for the mold to "enter" the polymer layer.

During the step of oxygen plasma etching of this residual layer at the bottom of the pattern, the polymer material is eliminated everywhere in the direction of the substrate. However, if the underlying surface of the substrate has been exposed in a location where the residual layer is originally very thin, continued application of the plasma (which is necessary to eliminate the residual layer where it is thickest) results in now lateral attacking of the polymer, reflected in a localized enlarging of the recesses of the pattern. As a consequence of this, the most isolated patterns (where the residual layer was thinnest) are reduced in size relative to the protrusions of the molds, whereas the most dense patterns (where the residual layer was thickest) remain strictly identical to the protrusions of the mold.

This thickness disparity is very difficult to avoid. The main pressing parameters are the pressing pressure, temperature and time. Tests have shown that, to etch lines 500 nm wide with a space between the lines that varies from 650 nm to 10 000 nm at a pressure of 50 bar at a temperature of 120° C., the residual thickness varies from 55 nm to 120 nm for a pressing time of 5 minutes, from 40 nm to 75 nm for a pressing time of 30 minutes and from 65 nm to 75 nm for a pressing time of 60 minutes. This demonstrates that the thickness disparity (the maximum thickness is generally observed for a distance between the lines of the order of 1000 nm) and that this disparity is reduced if the pressing time is increased.

It is therefore apparent that it is possible to obtain substantially uniform pressing in an array but that this implies temperatures and times that may appear too high and too long and therefore too costly (the higher the temperature, the shorter the pressing time needs to be).

This makes the above technique slower and therefore less advantageous than the standard methods.

However, the foregoing description relates to an array of given size, with particular patterns (made up only of lines, of the same width) and it may be concluded that although it is possible with well-adapted conditions to obtain an array of lines uniformly pressed in given sizes, it is virtually impossible under the same conditions to obtain a residual thickness of the same value in arrays with different pattern sizes and densities, and a fortiori with patterns of diverse shapes. Consequently, the complete investigation of homogenization of pressing has to be repeated as a function of the three parameters cited above as soon as the size of the array or the pressing patterns is changed.

To obtain imprints of good quality, it has been proposed, in particular in the document "Tri-layer systems for nano-imprint lithography with an improved process latitude" by A. LEBIB, Y. CHEN, F. CARCENAC, E. CAMBRIL, L. MANIN, L. COURAUD and H. LAUNOIS, published in Microelectronic Engineering 53 (2000) 175-178, to employ a technique using three layers on the substrate to be etched: this substrate is covered with a lower layer of PMGI resin cured at 270° C., in turn covered with a thin layer of germanium, in turn covered with an upper layer of PMMA or S1805 resin. The method comprises multiple steps: pressing the mold into only the upper layer, eliminating the residue of the imprinted portion of the upper layer, and transferring the pattern into the germanium layer by attacking this intermediate layer using the upper layer as a mask, this germanium layer thereafter serving as a mask for attacking the lower layer. This is followed by the deposition of a metal layer on the lower layer followed by elimination of the lower layer: the portions of the metal layer that were at the bottom of the recesses of this layer, on the surface of the substrate, are the only ones to remain and finally serve as a mask for attacking the substrate. Note that this method is of a different kind from that described above, since it is not the lower layer whose protruding portions serve as a mask for attacking the substrate, but rather the metal portions deposited directly on the substrate, corresponding to the recesses of the lower layer. This technique, involving deposition at the bottom of the recesses of the lower layer, is often called the "lift-off" technique.

SUMMARY

The invention consists in a lithography method involving substrate pressing that can be implemented on an industrial scale with a moderate number of operations, which yields good accuracy of the lithographed and then pressed patterns, with moderate pressing pressures, times and temperatures.

To this end, the invention proposes a method involving the pressing of a substrate, including a preparation step during which the substrate is covered with a layer, a pressing step in which a mold comprising a pattern of recesses and protrusions is pressed so as to penetrate part of the thickness of the aforementioned layer, an attacking step in which the layer is attacked until parts of the surface of the substrate have been stripped, and an etching step whereby the substrate is etched using an etching pattern which is defined by the mold pattern, which method is characterized in that the preparation step comprises a sub-step consisting of the formation of a lower sub-layer of curable material, a step involving the curing of said sub-layer and a sub-step consisting of the formation of an outer sub-layer which is adjacent to the cured sub-layer, the pressing step including penetration of the above-mentioned protrusions of the mold into this external sub-layer until it comes into contact with this cured lower sub-layer.

Note that using a layer of curable material that has undergone a curing treatment is not new in itself in the field of nano-imprinting, as the document cited above by LEBIB et al. teaches the stacking of three layers of which the lower layer has been subjected to a curing treatment. On the other hand, it has not before been proposed to exploit the hardness of a layer of this kind to use it as a stop layer during pressing of the mold, since it is specified in the above document that, to prevent the mold coming into contact with the substrate, the thickness of the upper layer is slightly greater than the depth of the mold, and it is even specified, as has already been mentioned, that the residue of the upper layer is removed before using it as a mask for the step of attacking the underlying layer; the document therefore does not disclose the use of a stop layer for the pressing (not even the germanium layer), and a fortiori does not disclose using a cured polymer stop layer.

The invention represents a simplification compared to known solutions, including lift-off techniques, since it provides accurate control over the depth of penetration of the mold all over the layer, which contributes to obtaining high accuracy of reproduction when etching the pattern of the mold.

However, the invention is more particularly beneficial when, as in the technique described at the start of the present document, the printed layer serves as a mask for etching the substrate, which corresponds to a method that is much simpler and much faster than lift-off methods. An advantageous embodiment of the invention is therefore one in which this lower sub-layer is formed in contact with the surface of the substrate and in that, during the attacking step, the lower sub-layer is excavated through the recesses of the external sub-layer and, during the etching step, the substrate is attacked through the same recesses.

A complementary simplification is obtained if the lower sub-layer and the external sub-layer are made of the same material, in which case only one material has to be provided, the two sub-layers being differentiated by the fact that one of them is cured and the other is not; this further simplifies the selection of the method of attacking the substrate, since it suffices to verify that it is compatible with this common material.

The curing treatment preferably includes heat treatment of the lower sub-layer at a temperature higher than its curing temperature and the pressing step is carried out at a pressing temperature slightly higher than the glass transition temperature of the external sub-layer. The material is preferably a polymer, for example a resin that can be cross-linked. The material is a negative resin, for example, or a positive resin.

The minimum thickness of the lower sub-layer for it to serve efficiently as a stop layer varies in accordance with diverse parameters, including the pressing pressure and the nature of the polymer material; it is also recommended that this thickness be not much greater than the minimum thickness so as not to increase unnecessarily the time of attacking the sub-layer to expose the surface of the substrate locally. Given these observations, it is advantageous if the lower sub-layer has a thickness from 0.01 micron to 1 micron.

To facilitate the penetration of the mold into the external sub-layer as far as the internal sub-layer, the thickness of the external sub-layer is advantageously less than the depth of the recesses of the pattern of the mold.

The substrate is preferably of silicon, which is a material that is very well known in micro-electronic applications. However, the material constituting the substrate (or at least the portion thereof that is to be etched) may be selected from a wide range of materials usable in microtechnologies, among which may be mentioned germanium, SiGe alloys (with varied proportions), InP, AsGa, etc.

BRIEF DESCRIPTION OF THE DRAWING

Aspects, features and advantages of the invention will emerge from the following description, which is given with reference to the appended drawing, in which:

FIG. 1 is a diagram of a first step of the method of the invention in which a mold is positioned on a layer formed on a substrate, FIG. 2 is a diagram of a second step in which the mold is pressed into the layer as far as a stop sub-layer, FIG. 3 is a diagram of a third step in which, following removal of the mold, the stop sub-layer is attacked, FIG. 4 is a diagram of a fourth step in which the substrate is etched, and FIG. 5 is a graph of the residual thickness after pressing the mold as a function of the characteristics of the pattern to be reproduced.

FIGS. 1 to 4 represent four stages of the method of the invention, using a substrate 1 on which a layer 2 has been formed, and a mold 3 with a pattern formed of protrusions 4 and recesses 5 defining a pattern in accordance with which the substrate is to be etched. Here the substrate and the mold are made from the same material, for example silicon.

FIG. 1 represents a step in which the layer 2 has been formed on the substrate in the form of two sub-layers, namely an internal sub-layer 2A and an external layer 2B, and in which the mold is positioned on this layer, at the moment of commencing pressing.

The internal sub-layer 2A layer is formed of a curable material. It is first formed on the free surface of the substrate (with or without a native oxide layer), and then treated to cure it.

The material of the internal layer may be a polymer or any other material softer than the material of the substrate (at least in its surface portion). In the case of a polymer, the curing treatment is a heat treatment at a temperature higher than its curing temperature. This polymer is preferably chosen to have a glass transition temperature higher than the temperature at which the pressing is to be conducted. It is additionally selected so that, after pressing, it can be etched to expose the surface of the substrate locally, for example by means of an oxygen plasma. It is advantageously a resin that can be cross-linked.

After the curing treatment of the lower sub-layer 2A, there is formed on the cured layer the external sub-layer 2B that is to constitute the external portion of the coating of the substrate.

The external sub-layer 2B is made from any appropriate known material, for example a thermoplastic polymer, capable of being deformed, where applicable after heating it to above a softening threshold. It may be a polymer or a resin that can be cross-linked.

It is entirely advantageous if this external sub-layer is formed of the same material as the lower sub-layer but no curing treatment is applied to this external sub-layer, including during heating, if any, for pressing.

The material constituting these two layers is advantageously a negative resin routinely used in micro-electronics that has a thermally activated cross-linking agent. When the resin is heated to a temperature above its cross-linking temperature, the cross-linking agent becomes active and joins the macromolecules together. These macromolecules being no longer able to move, the polymer becomes hard, and this change cannot be reversed.

In practice, whether the external sub-layer 2B is of the same material as the internal sub-layer 2A or not, it is advantageously subjected to a standard treatment, involving a heat treatment, that is insufficient to induce curing but sufficient to stabilize the polymer.

FIG. 2 represents a stage in which pressing has taken place (where applicable after heating) and has continued until the protrusions of the mold have come into contact with the internal-sub-layer 2A. This stop layer has a damping function during pressing.

It is seen that the recesses of the mold, between the protrusions, are incompletely filled with the material constituting the external sub-layer 2B. This is because the recesses of the mold have a depth that is greater than the thickness of the external sub-layer 2B, which prevents the penetration of the protrusions 4 of the mold 3 into the sub-layer 2A being blocked by the beads 2C of material forced into the recesses. Accordingly, regardless of the density of the patterns of the molds, whether they are isolated or densely packed, pressing can easily be effected over the whole of the substrate, even if it is large. After it has been cured, the internal sub-layer 2A is sufficiently hard to resist penetration by the protrusions but remains sufficiently elastic to absorb the applied pressure. It is guaranteed that all the protrusions come to a given distance from the surface of the substrate (equal to the thickness of the sub-layer 2A -see also FIG. 5), without any attendant risk of contact between the mold 3 and the substrates, and therefore of mutual damage of these elements.

Note that, the greater the difference between the thickness of the sub-layer and the depth of the recesses of the mold, the lower the risk of localized complete filling of the recesses, and the easier the subsequent removal of the mold. Complementing this, since the recesses are not filled, the mechanical stresses within the mold remain substantially uniform during pressing, with the result that the mold is virtually undeformed, which increases its durability.

It has become apparent that it is possible to obtain good contact between the protrusions of the mold and the stop layer without damaging the latter.

FIGS. 3 and 4 represent the remainder of the method of etching the substrate 1, comprising steps known in the art.

In FIG. 3, the mold has been removed, leaving only the beads of the material of the sub-layer that have formed in the recesses of the mold 3. Using beads as an etching mask, the stop layer has been etched, for example by means of an oxygen plasma (the substrate being of silicon), to expose the substrate portions.

In FIG. 4, the recesses formed in the stop layer have been used as a mask for etching the substrate, by any appropriate means known in the art, such as the plasma etching process conventionally used in lithography, in accordance with a pattern that is defined by that of the mold. The recesses of the substrate correspond very precisely to the protrusions of the mold.

It is thus possible to obtain the required accuracy with lower pressures than in prior art solutions, for example 15 bar instead of 50 bar, applied for 5 minutes instead of 30 minutes. This simplifies determining the dimensions of the pressing installation and reduces its overall size.

FIG. 5 represents the results obtained with diverse configurations: a set of lines in the mold whose width L varies from 0.35 microns to 0.5 microns, a thickness E between the lines that varies from 0.35 microns to 0.5 microns following pressing at 15 bar for 10 minutes at 140° C., the external and lower sub-layers being of the same negative resin. When the residual thickness of the stop sub-layer finally obtained after contact of the mold with that sub-layer is measured, it is seen that, despite a few fluctuations that may be attributed to different possibilities of local crushing between the regions in question, it remains substantially uniform from one line to another, included in all cases in a range of the order of from 40 nanometers to 60 nanometers; this also establishes that the thickness of this stop sub-layer may be as little as a few tens of nanometers, which is very thin. In this example:

the thickness of the initial external layer is 100 nm
and the depth of the patterns of the mold is 250 nm The invention claim is:

1. A lithographic method comprising the pressing of a substrate, the method comprising:
  preparing a substrate surface by forming a composite layer on the substrate, wherein forming the composite layer comprises forming an internal sub-layer of curable material in contact with the substrate surface and curing the internal sub-layer, and forming an external sub-layer adjacent to the cured internal sub-layer;
  pressing a mold comprising a pattern of recesses and protrusions, wherein the protrusions of the mold penetrate into the external sub-layer until the protrusions contact the internal sub-layer;
  performing at least one etching process in which the composite layer is etched by removing the internal sub-layer in regions defined by recesses formed in the external sub-layer until portions of a surface of the substrate have been exposed; and
  etching portions of the substrate exposed by the recesses using an etching pattern defined by the mold pattern.

2. The method according to claim 1, wherein forming the internal sub-layer and the external sub-layer comprise forming the same material.

3. The method according to claim 1, wherein curing the internal sub-layer comprises heating the internal sub-layer at a temperature higher than a curing temperature of the internal sub-layer, and wherein pressing the mold comprises pressing at a pressing temperature higher than a glass transition temperature of the external sub-layer.

4. The method according to claim 1, wherein forming the internal sub-layer of a curable material comprises forming a polymer.

5. The method according to claim 1, wherein forming the internal sub-layer of a curable material comprises forming a resin configured to be cross-linked.

6. The method according to claim 4, wherein forming the internal sub-layer of a curable material comprises forming one of a negative resin or a positive resin.

7. The method according to claim 1, wherein forming the internal sub-layer comprises forming a sub-layer having a thickness of 0.01 micron to 1 micron.

8. The method according to claim 1, wherein forming the external sub-layer comprises forming the external sub-layer to a thickness less than a depth of the pattern of recesses.

9. The method according to claim 5, wherein forming a resin comprises forming one of a negative resin or a positive resin.

10. A lithographic method comprising:

forming a first layer in contact with a surface of a substrate, the first layer comprising a curable material, and curing the first layer;

forming a second layer on the first layer, the second layer comprising a deformable material;

pressing a mold against the second layer, wherein protrusions of the mold form recesses in the second layer that expose portions of the first layer;

etching the exposed portions of the first layer using the second layer as an etch mask, and exposing surface regions of the substrate; and etching the surface regions of the substrate using at least the first layer as an etching mask.

11. The method according to claim 10, wherein forming a first layer and a second layer comprise forming the same material.

* * * * *

UNITED STATES PATENT AND TRADEMARK OFFICE
CERTIFICATE OF CORRECTION

PATENT NO. : 7,682,515 B2
APPLICATION NO. : 10/539875
DATED : March 23, 2010
INVENTOR(S) : Corinne Perret et al.

Page 1 of 1

It is certified that error appears in the above-identified patent and that said Letters Patent is hereby corrected as shown below:

On the Title Page

Item (75), replace "Quaix-en-Chartreuse" with --Quaix-En-Chartreuse--.

Item (75), replace "La-Tour-du-Pin" with --La-Tour-Du-Pin--.

Item (73), replace "Commissarieat A l'Energie Atomique" with --Commissariat a L'Energie Atomique--.

Item (73), replace "Centre National De La Recherche" with --Centre National de la Recherche Scientifique--.

Signed and Sealed this
Nineteenth Day of July, 2011

David J. Kappos
*Director of the United States Patent and Trademark Office*